United States Patent [19]

Emrhein

[11] Patent Number: 5,713,474
[45] Date of Patent: Feb. 3, 1998

[54] INNERLAYER SURFACE TREATING RACK

[75] Inventor: Gary John Emrhein, Midlothian, Va.

[73] Assignee: Viasystems Technologies Corporation, Richmond, Va.

[21] Appl. No.: 520,192

[22] Filed: Aug. 28, 1995

[51] Int. Cl.$^6$ ................................................ A46F 7/00
[52] U.S. Cl. ................................... 211/41; 206/454
[58] Field of Search ........................ 211/41; 118/728, 118/500; 269/87.2; 206/454; 432/253; 427/248.1

[56] References Cited

U.S. PATENT DOCUMENTS

| | | | |
|---|---|---|---|
| 1,885,691 | 11/1932 | Dressler | 432/253 |
| 3,682,083 | 8/1972 | Puente | 206/454 X |
| 4,086,263 | 4/1978 | Rowley | 206/454 |
| 4,152,164 | 5/1979 | Hofmeister et al. | 206/454 X |
| 4,382,517 | 5/1983 | Welsch | 206/454 X |
| 4,714,304 | 12/1987 | Sisk et al. | 312/214 |
| 5,101,976 | 4/1992 | Salisbury | 206/454 |
| 5,269,422 | 12/1993 | Chevrette | 206/454 X |
| 5,351,836 | 10/1994 | Mori et al. | 206/454 X |
| 5,370,142 | 12/1994 | Nishi et al. | 206/454 X |
| 5,503,173 | 4/1996 | Kudo et al. | 206/454 X |

Primary Examiner—Robert W. Gibson, Jr.
Attorney, Agent, or Firm—Oliff & Berridge, P.L.C.

[57] ABSTRACT

A rack to hold at least one innerlayer component, which has a length, a width and a thickness, includes dividers and a frame. The dividers are fabricated of a non-conductive material and disposed to receive the innerlayer component. The frame is dimensioned to receive the dividers. The frame has a first dimension at least as great as the length of the innerlayer component. The frame has a second dimension at least as great as the width of the innerlayer component. The innerlayer component does not contact the frame. As a result, the rack prevents defects from arising during the innerlayer component production process.

25 Claims, 10 Drawing Sheets

INNERLAYER SURFACE TREATING RACK

BACKGROUND OF THE INVENTION

1. Field of the Invention

The present invention relates to handling devices, and in particular, to a rack that facilitates the processing, transportation and storage of innerlayers during the production of printed circuit boards.

2. Description of Related Art

An innerlayer is a sheet-like component of a printed circuit board on which a circuit pattern is etched. Innerlayers typically range in thickness from about 4 mil to about 0.190 in. During large-scale production of printed circuit boards, innerlayers are subjected to various chemical processes including, e.g., a brown oxide conversion coating operation that enables the innerlayers to be soldered more readily. Conventionally, several of these innerlayers are arranged on a rack such that each innerlayer is separated from the others, but remains exposed for processing. The racks allow several innerlayers to be handled and processed simultaneously.

The conventional racks include a steel framework of vertical and horizontal members connected to each other by welds. The steel is coated, e.g., with plastic, to prevent contact or any reaction between the rack and the innerlayer during the production process. Over time, however, the coating deteriorates due to various chemicals used during the production process and abrasion from contact with machinery, etc. Without adequate coating, the copper areas of the innerlayer can contact the rack and cause sparks. As a result, both aesthetic and functional defects occur. To prevent these undesirable defects, the quality of the rack coating quality must be continually monitored, and if necessary, repaired. Recoating damaged racks, however, is expensive. Because conventional racks require considerable maintenance resources, providing a rack that would allow effective innerlayer processing without requiring substantial maintenance would be desirable.

SUMMARY OF THE INVENTION

An object of the present invention is to provide a rack assembly for processing innerlayers that prevents defects in the innerlayers from occurring. Another object of the invention is to provide a rack assembly that can be maintained easily by substituting components without requiring, e.g., welding.

To achieve these and other objects, a rack to hold at least one innerlayer component during a production process is provided. The innerlayer component has a length, a width and a thickness. The rack includes dividers and a frame. The dividers are fabricated of a non-conductive material and disposed to receive the innerlayer component. The frame is dimensioned to receive the dividers. The frame has a first dimension at least as great as the length of the innerlayer component. The frame has a second dimension at least as great as the width of the innerlayer component. The innerlayer does not contact the frame. A third dimension between opposite sides of the frame is determined by a length of the dividers that are disposed between the opposite sides of the frame.

The dividers can include a receiving portion dimensioned to be at least as great as the thickness as the innerlayer component. Preferably, the dividers are fabricated of a polyphenylene oxide.

The rack can also include at least one separator rod that is received through apertures in each of the dividers. The separator rod can extend approximately parallel to the first dimension of the frame and abut against the frame to secure the divider. Preferably, the separator rod is fabricated of a polyphenylene sulfide.

The frame may include an upper portion connected to a bottom portion by vertical members. In this case, the vertical members have a height at least as great as the width of the innerlayer component. Each of the dividers can be disposed between two of the vertical members on opposite sides of the frame. The lower ends of the two vertical members can be joined by a bottom member having a channel portion dimensioned to receive one of the dividers. The bottom portion of the frame can include a support rod that projects beyond the frame. In this case, the support rod allows the rack to pivot in a machine frame so that the innerlayer can be loaded or unloaded when the rack is pivoted. The frame may also include a mid-level stop disposed to limit the range through which the rack can pivot, e.g., by engaging the machine frame.

The dividers may include middle dividers and end dividers. The middle dividers have slots and the end dividers have grooves aligned with the slots. The slots and the grooves are at least as wide as the thickness of the innerlayer such that the dividers can secure the innerlayer. The slots and the middle dividers can be wider at a receiving end and can terminate at a bottom end. The middle dividers and the end dividers can include apertures disposed near the receiving end through which the separator rods extend.

The frame may be fabricated of stainless steel. The members of the frame may be connected to each other by spot welding. The frame may also include at least one threaded connection between the members to allow the dividers and the separator rod or rods to be removed. The threaded connection may include bolts through an upper horizontal member that is disposed at one end of the frame.

BRIEF DESCRIPTION OF THE DRAWINGS

A complete understanding of the present invention may be obtained by reference to the accompanying drawings, when considered in conjunction with the subsequent detailed description thereof, in which.

DETAILED DESCRIPTION OF PREFERRED EMBODIMENTS

Figure 1:
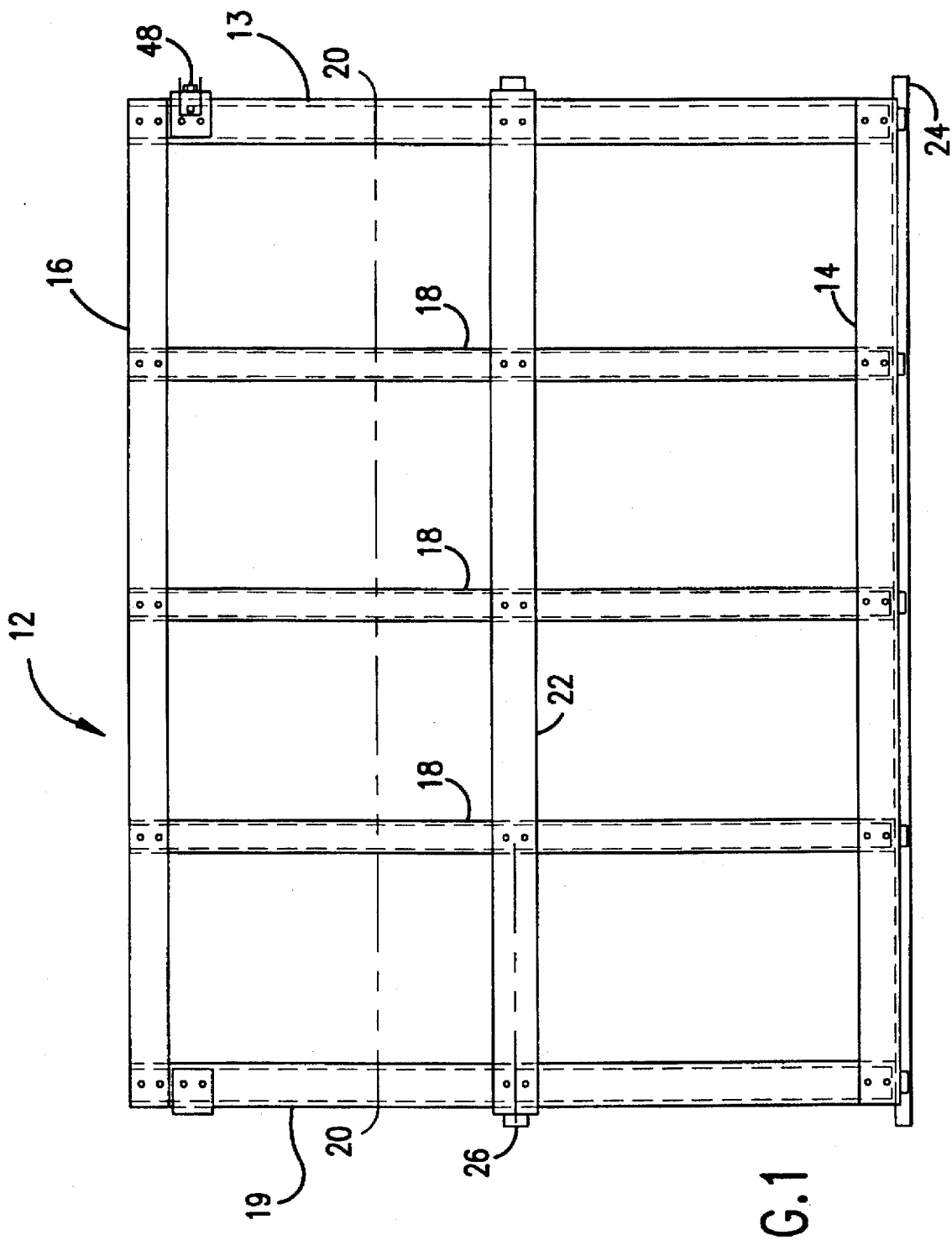
FIG. 1 is a side view of a frame of a rack assembly of the present invention.
Figure 2:
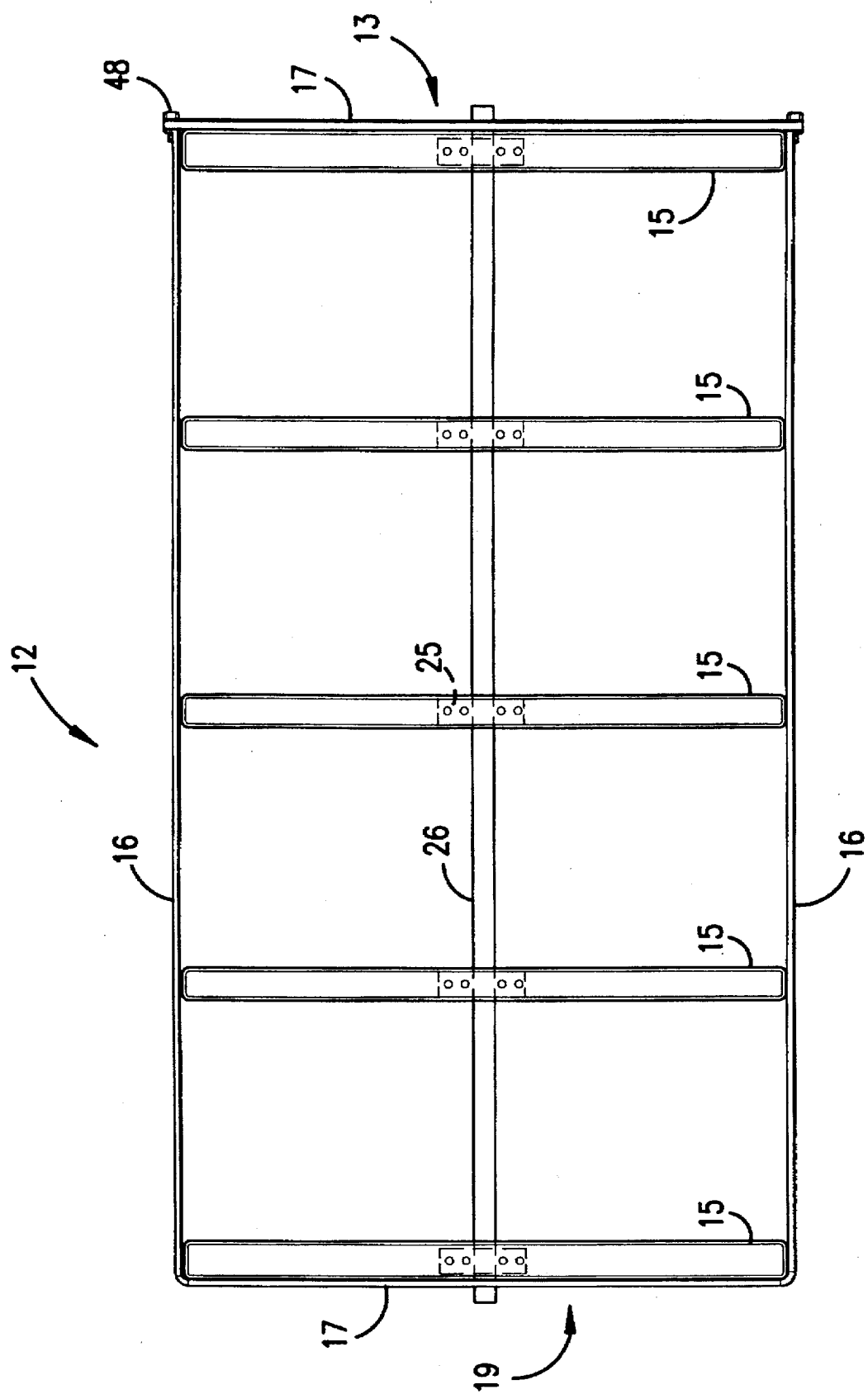
FIG. 2 is a plan view of the frame shown in FIG. 1.
Figure 3:
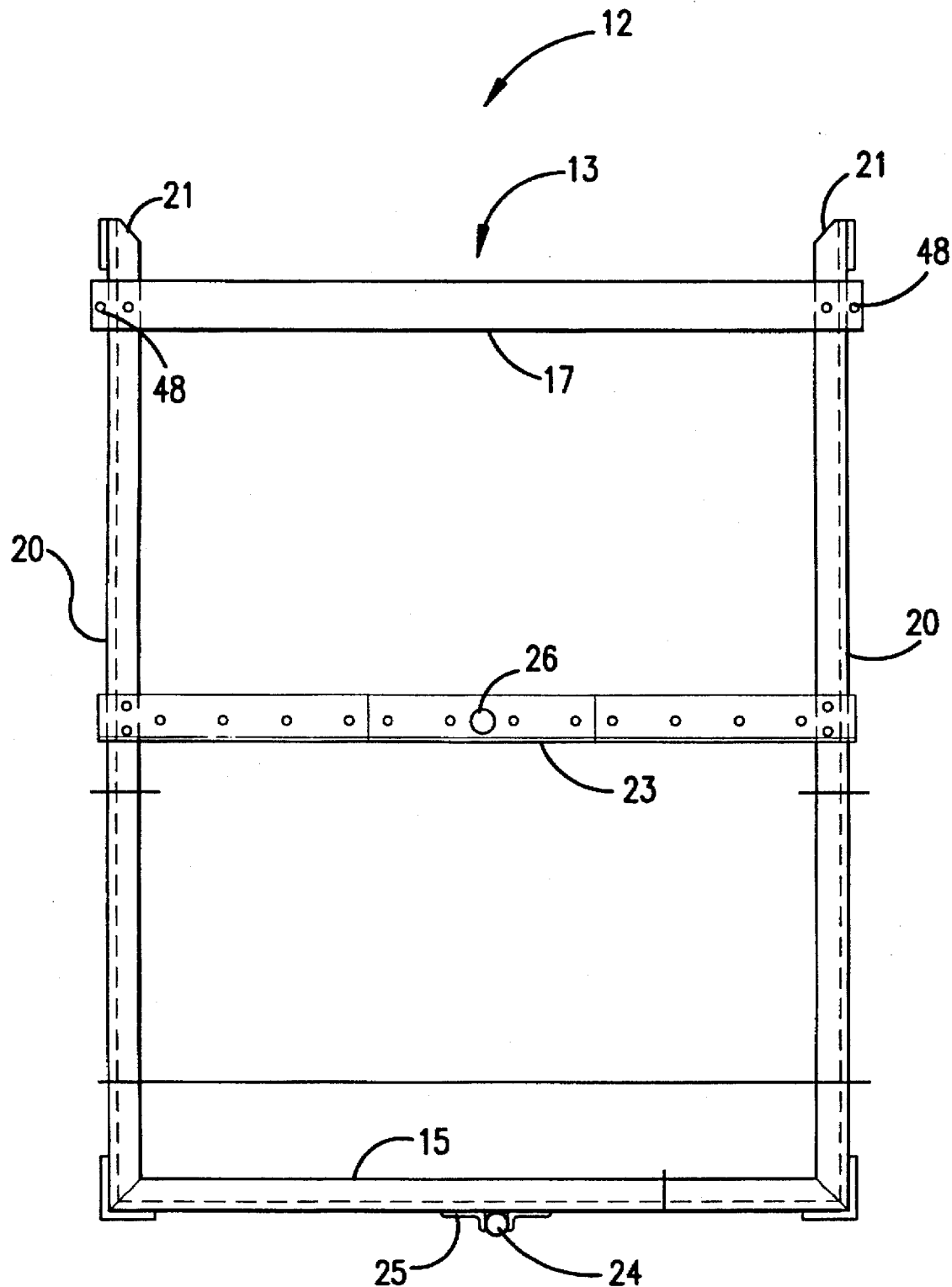
FIG. 3 is a front side view of the frame shown in FIGS. 1 and 2.

FIGS. 1, 2 and 3 illustrate side, plan and front elevation views, respectively, of a frame 12 of a rack assembly 10 according to the present invention. A bottom support rod 24 is centrally disposed and extends longitudinally from a front side 13 through a rear side 19. The ends of the bottom support rod 24 project beyond the frame 12 and engage corresponding receptacles in production machinery, such as a machine frame (see FIG. 11). The bottom support rod 24 extends perpendicular to and is suspended by brackets 25 attached beneath five minor bottom members 15 at their midpoints. Each end of each minor bottom member 15 is connected to a major bottom member 14 that extends longitudinally and parallel to the bottom support rod 24.

A vertical end member 20 extends upward from each of the four corners formed by the intersection of the outer minor bottom members 15 and each major horizontal member 14. vertical members 18 extend upward from the intersection of the inner minor bottom members 15 and each major horizontal member 14. An upper end 21 of each vertical end member 20 is chamfered to facilitate installation and removal of the dividers, which are discussed below in greater detail.

Each of the vertical end members 20 and the vertical members 18 are connected to a major midlevel member 22 that extends parallel to the major bottom member 14. A minor midlevel member 23 extends between and is connected to each vertical end member 20 and extends parallel to the minor bottom members 15. A midlevel stop 26 is connected to and projects outwardly from a center of each minor midlevel member 23. The midlevel stop 26 is vertically aligned with the bottom support rod 24. The major midlevel member 22 and the minor midlevel member 23 are connected to each vertical end member 20 and the vertical members 18 at a point approximately midway between the top and the bottom of the frame 12.

Figure 11:
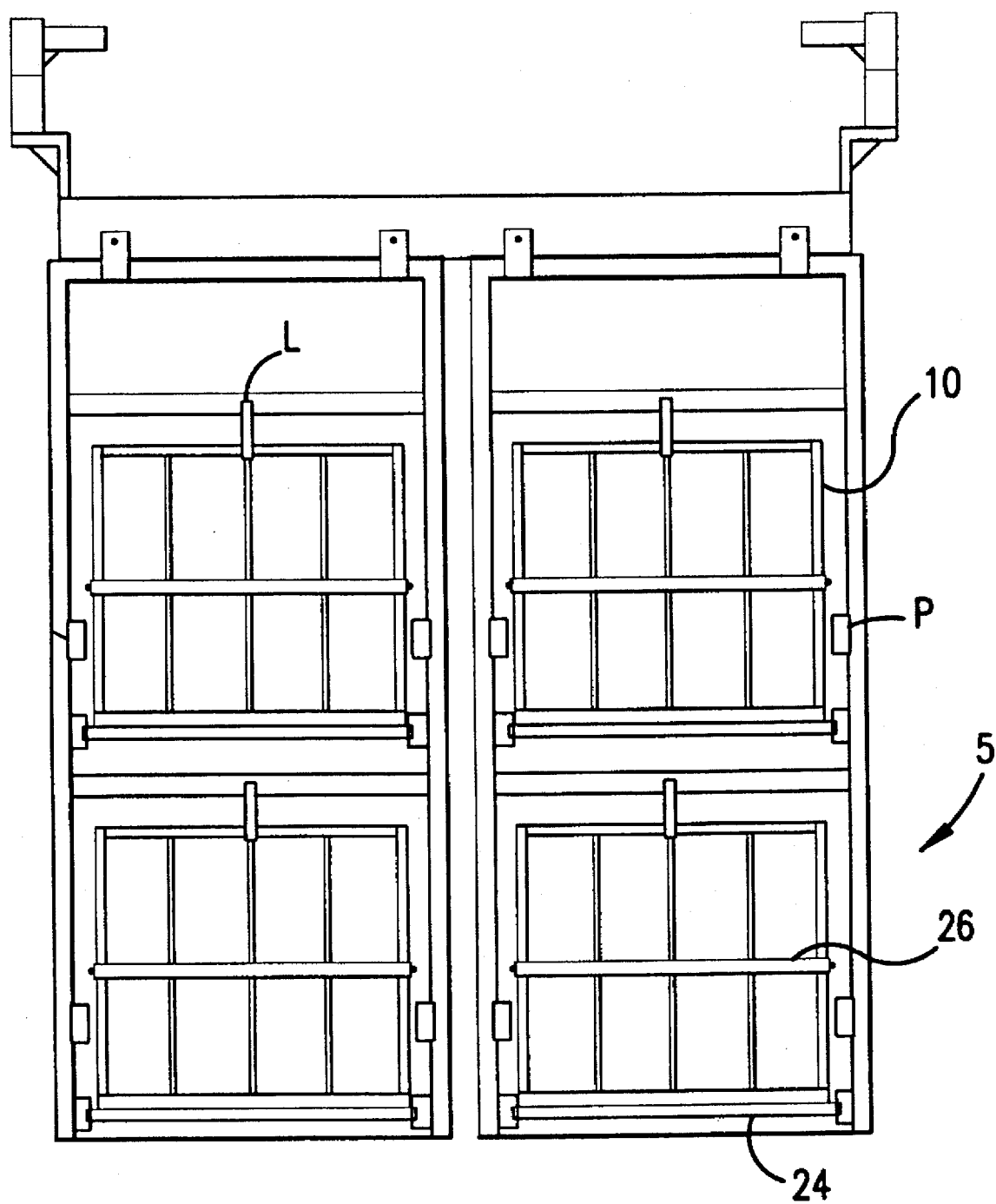
FIG. 11 is a fron view of a machine frame in which four racks are installed.
Figure 12:
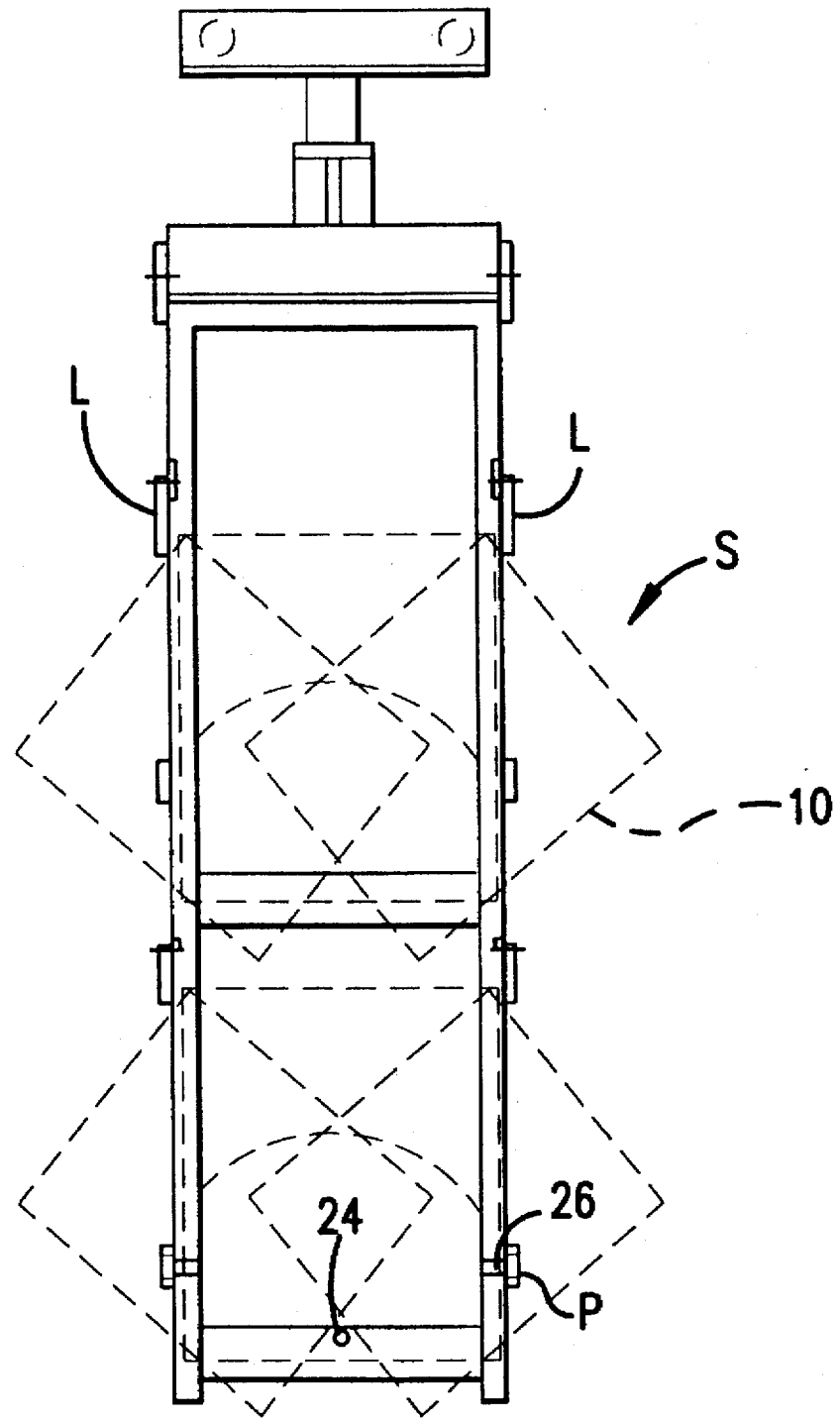
FIG. 12 is a side view of the machine frame of FIG. 11 that shows the rack assemblies in their operating and loading/unloading positions.

As illustrated in FIGS. 11 and 12, the midlevel stop 26 of each rack contacts a plate P on the production machinery, such as a machine frame S, to prevent the frame 12 from pivoting around the bottom support rod 24 by more than approximately 30 degrees. When the rack is in a pivoted loading/unloading position depicted by the dotted outline in FIG. 12, the innerlayers can be easily loaded or unloaded. The rack is secured in an upright operating position depicted by the solid lines by a latch mechanism L mounted to the machine frame S.

A major upper member 16 extends parallel to each major bottom member 14 and is connected to each vertical end member 20 and the vertical members 18. A minor upper member 17 extends parallel to the minor bottom members 15 and is connected to the vertical end member 20 at each end of the frame 12. The major upper member 16 and the minor upper member 17 are connected to each vertical end member 18 and each vertical member 20 at approximately the top of the frame 12.

Preferably, the minor bottom members 15 include channels having an opening dimensioned to receive the dividers, and a distance between adjacent minor bottom members 15 is approximately six inches. The other members are preferably formed of right angle stock and flat bar stock, as required. With the exception of the connection between the minor upper member 17 and the vertical end members 20 at the front side 13 of the frame 12, the other members are connected by conventional spot welding. The minor upper member 17 at the front side 13 is connected to each vertical end member 20 at the front side by screws 48 or other conventional threaded connections, or by an alternative arrangement that allows the minor upper member 17 to be removed easily. Other equivalent methods known to those of ordinary skill in the art, however, could be used. All of the elements of the frame are preferably fabricated of stainless steel to minimize any chance of a reaction between the frame and the chemicals used during the production process.

Figure 4:
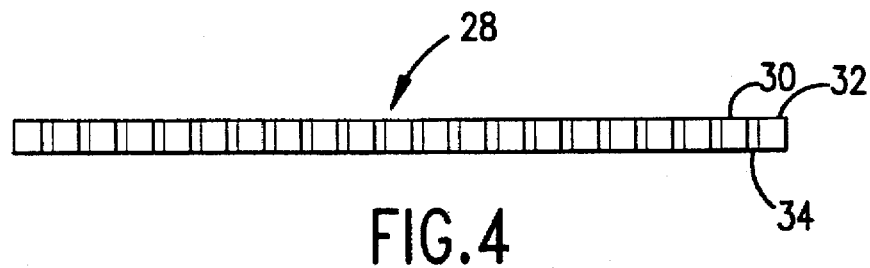
FIG. 4 is a plan view of a middle divider.
Figure 5:
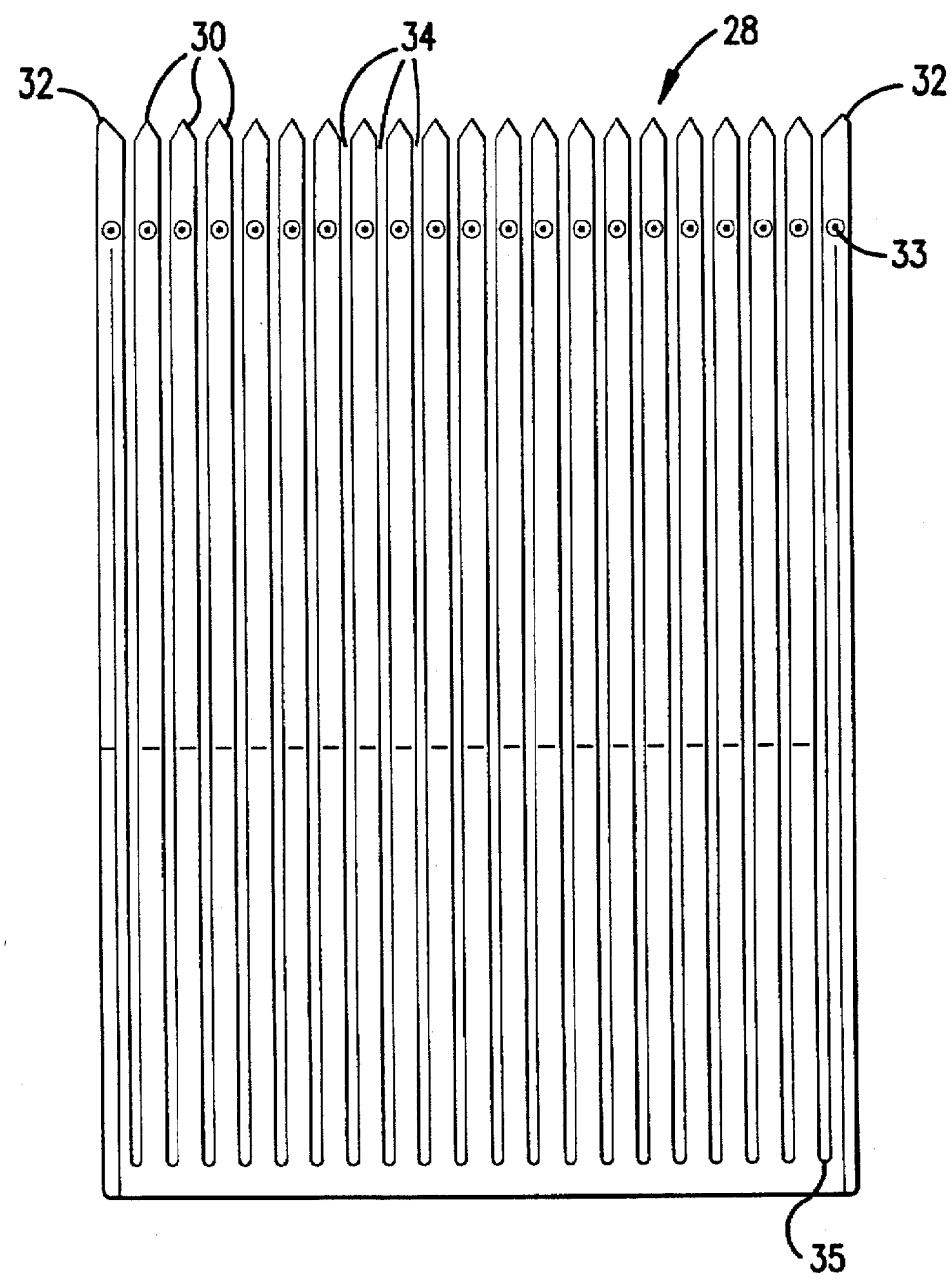
FIG. 5 is a side view of the middle divider of FIG. 4.

FIGS. 4 and 5 illustrate plan and side elevation views of a middle divider 28 according to the present invention. A number of middle divider fingers 30 extend upward from a middle divider base 35. A middle divider end finger 32 also extends from each end of the middle divider base 35. The middle divider fingers 30 terminate in pointed tips. Each middle divider end finger 32 terminates in a tip that is beveled on its inner side.

Middle divider slots 34 are formed by the spaces between each middle divider end finger 32 and the middle divider fingers 30. Each middle divider end finger 32 and each of the middle divider fingers 30 includes a separator rod aperture 33.

Figure 6:
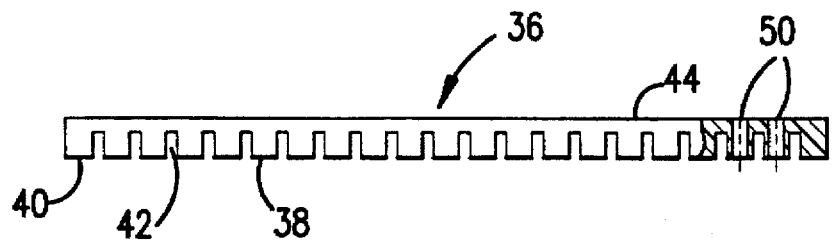
FIG. 6 is an plan view of an end divider.
Figure 7:
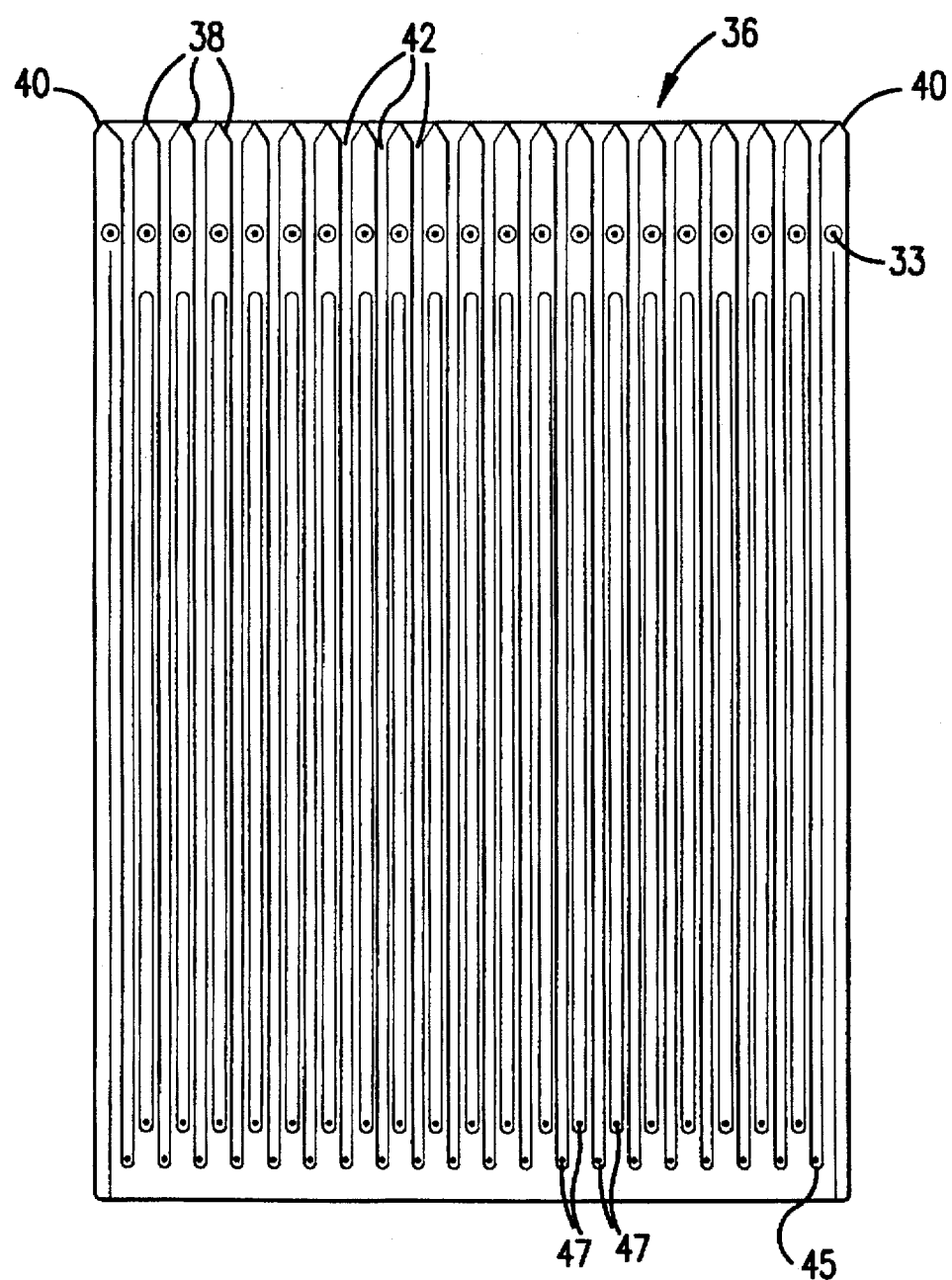
FIG. 7 is a side view of the end divider of FIG. 6.

FIGS. 6 and 7 illustrate plan and side elevation views of an end divider 36 according to the present invention. A number of end divider fingers 38 extend upward from an end divider base 45. An end divider end finger 40 also extends from each end of the end divider base 45. The end divider fingers 38 terminate in pointed tips. Each end divider end finger 40 terminates in a tip that is beveled on an inner side.

Similar to the middle divider slots 34, grooves or end divider slots 42 are formed by spaces between each end divider end finger 40 and the end divider fingers 38. Unlike the middle divider slots 34 that extend completely through the middle divider 28, however, the end divider slots 42 terminate at an end divider end surface 44. Also, consecutive ones of the end divider fingers 38 and the end divider base 45 are connected transversely to the end divider end surface 44 to form a receiving wall 47 at respective distal ends of each groove or end divider slot 42 as shown in FIG. 7. Each end divider end finger 40 and each of the end divider fingers 38 includes a separator rod aperture 33.

The middle divider 28 and the end divider 36 are fabricated of a plastic material, preferably NORYL (polyphenylene oxide, modified). The NORYL material exhibits desirable properties in view of the production environment, including, e.g., low moisture absorption, a high melting point, good electrical insulating qualities and superior impact strength. The NORYL material is also less expensive than TEFLON, which is an acceptable substitute.

Figure 8:
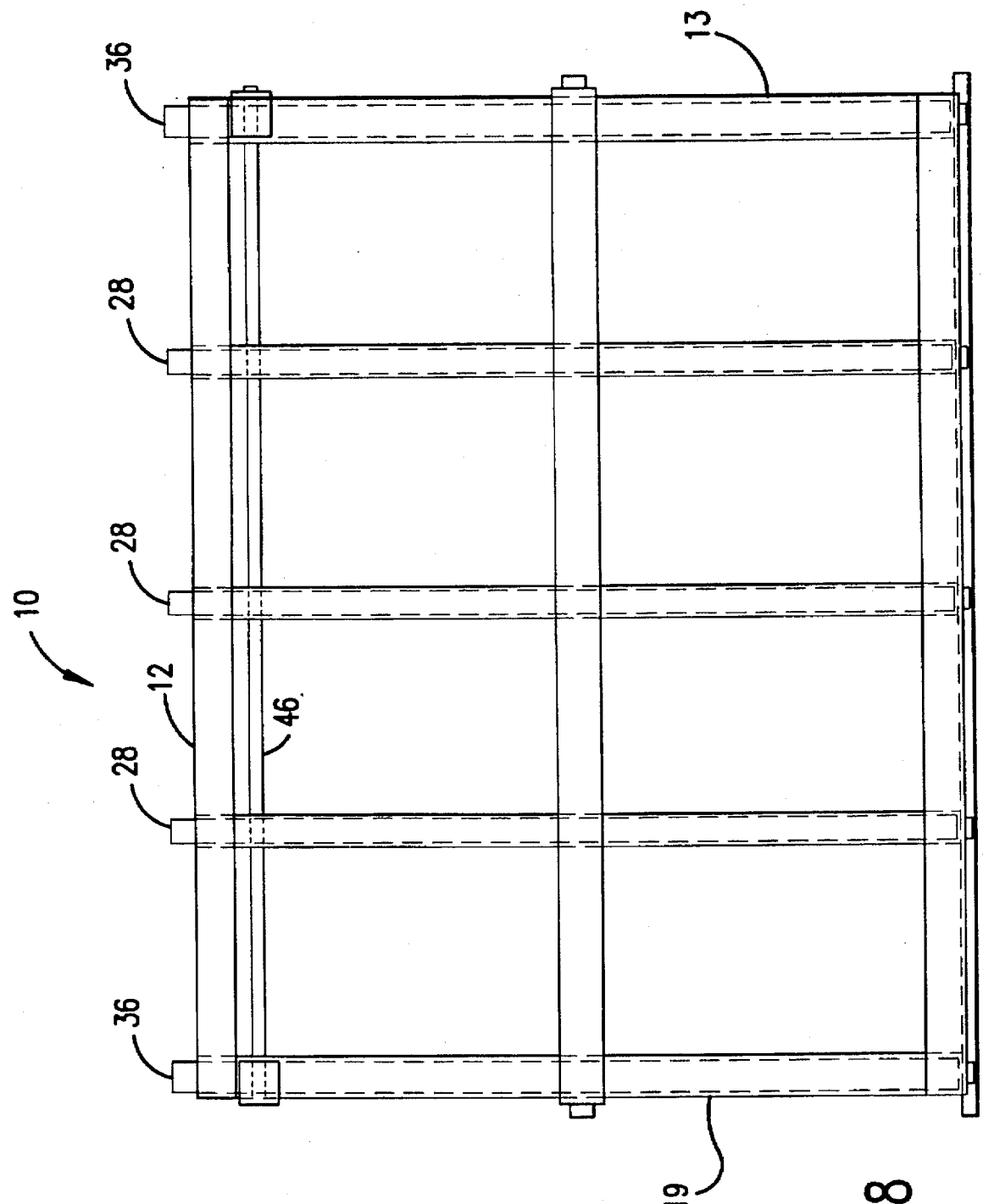
FIG. 8 is a side view of the rack assembly.
Figure 9:
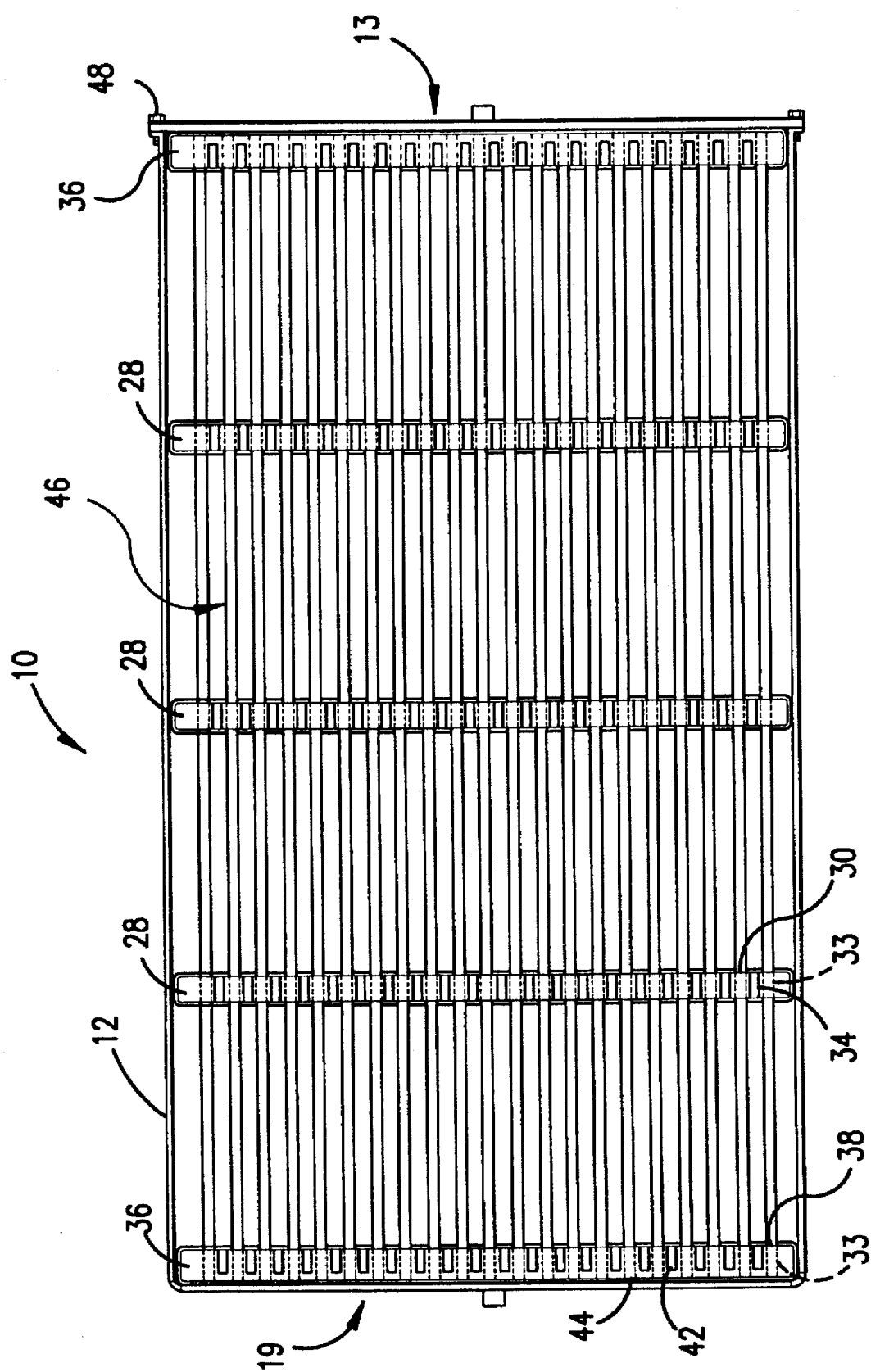
FIG. 9 is a plan view of the rack assembly shown in FIG. 8.
Figure 10:
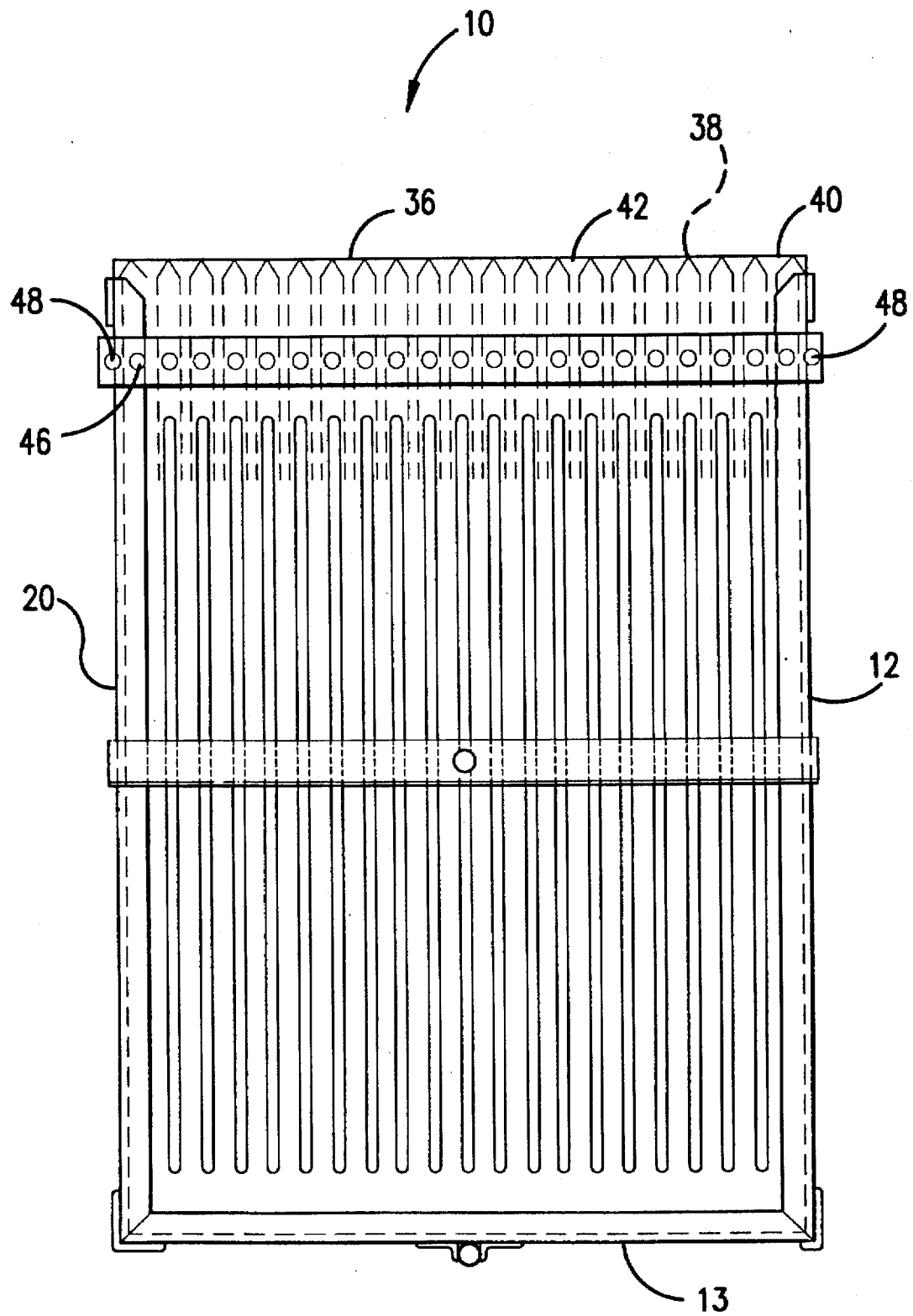
FIG. 10 is a front side view of the rack assembly shown in FIGS. 8 and 9.

FIGS. 8, 9 and 10 illustrate side, plan and front elevation views, respectively, of the rack assembly 10. Each middle divider 28 and each end divider 36 is inserted from the top of the frame into its respective space defined by the minor bottom members 15, each vertical member 18 and each vertical member 20. The innerlayers are inserted from the top of the rack into spaces that are slightly greater than the thickness of the innerlayers, the spaces being defined by the slots of the middle dividers that are aligned with the grooves of the end dividers. In a preferred embodiment, each rack can receive twenty innerlayers.

In a preferred embodiment, each innerlayer is held at five points, i.e., by each one of the five dividers. Because even plastic dividers can produce undesirable rack marks on the innerlayers, the number of dividers must be optimized in view of securely holding the innerlayers yet minimizing the number of rack marks. As a result, the innerlayers contact only the dividers and not the frame 12 during the production process, thereby reducing the chances that a reaction between the rack assembly 12 and the innerlayers will occur.

Separator rods 46 are inserted from the front side 13 through the separator rod apertures 33 in each middle divider 28 and each end divider 36. The separator rods 46 secure the dividers in place, but are removable to allow the frame 12 or the dividers to be cleaned, repaired or replaced. The separator rods 46 are preferably fabricated of TECHTRON (polyphenylene sulfide). Although TECHTRON is more expensive than NORYL, TECHTRON provides the preferred dimensional stability and stiffness required of the separator rods 46, in addition to providing the other desirable qualities of NORYL. The minor upper member 17 at the front end 13 is secured to the frame 12 by the screws 48, further preventing the dividers or the separator rods from being displaced.

Occasionally, a malfunction in the processing machinery occurs, resulting in an abrupt change in the operating speed and causing the racks to crash into nearby structures. In the event that a rack is damaged or requires other maintenance, the minor upper member 17 at the front end 13 can be detached by removing bolts to provide access to the separator rods and the dividers. Accordingly, the present invention reduces the number of defects in the innerlayers, lowers maintenance costs, and improves the overall efficiency of the production process.

Although this invention is described in conjunction with specific embodiments thereof, many alternatives, modifications and variations will be apparent to those skilled in the art. Accordingly, the preferred embodiments of the invention as set forth above are intended to be illustrative, not limiting. Various changes to the invention may be made without departing from its true spirit and scope of the invention as defined in the following claims.

What is claimed is:

1. A rack to hold at least one innerlayer component of a printed circuit board during a production process, said at least one innerlayer component having a length, a width and a thickness, said rack comprising:

at least one divider fabricated of a non-conductive material and disposed to receive said at least one innerlayer component in a slot formed between vertically extending fingers; and a frame dimensioned to receive said at least one divider in a manner whereby said at least one divider is slidably contained and cradled within said frame, said frame having a first dimension at least as great as said length, said frame having a second dimension at least as great as said width, wherein at least one said innerlayer component does not contact said frame.

2. The rack of claim 1, wherein said slot is dimensioned at least as great as said thickness of said at least one innerlayer component.

3. The rack of claim 1, wherein said frame has a third dimension between opposite sides of said frame determined by a length of said at least one divider disposed between said opposite sides.

4. The rack of claim 1, wherein said at least one divider is fabricated of a polyphenylene oxide.

5. The rack of claim 1, further comprising at least one separator rod, wherein said at least one divider includes an aperture dimensioned to receive said at least one separator rod.

6. The rack of claim 5, wherein said at least one separator rod extends approximately parallel to said first dimension and abuts against said frame to secure said at least one divider within said frame.

7. The rack of claim 5, wherein said at least one separator rod is fabricated of a polyphenylene sulfide.

8. The rack of claim 1, wherein said frame includes an upper portion connected to a bottom portion by vertical members, said vertical members having a height at least as great as said width of said at least one innerlayer component.

9. The rack of claim 8, wherein said at least one divider is disposed between two of said vertical members on opposite sides of said frame.

10. The rack of claim 8, wherein said bottom portion includes a support rod that projects beyond said frame, said support rod allowing said rack to pivot in a machine frame, whereby said at least one innerlayer can be loaded or unloaded when said rack is pivoted.

11. The rack of claim 10, further comprising a midlevel stop disposed to limit a range through which said rack can pivot.

12. The rack of claim 11, wherein said midlevel stop limits said range by engaging said machine frame.

13. The rack of claim 1, wherein said at least one divider includes middle dividers and end dividers, said middle dividers having slots and said end dividers having grooves aligned with said slots, said slots and said grooves being at least as wide as said thickness of said at least one innerlayer such that said middle and end dividers secure said at least one innerlayer.

14. The rack of claim 13, wherein said slots of said middle dividers and said grooves of said end dividers are wider at a receiving end and terminate at a bottom end.

15. The rack of claim 14, wherein said middle dividers and said end dividers have apertures disposed near said receiving end, said rack further comprising separator rods disposed through said apertures.

16. The rack of claim 1, wherein said frame is fabricated of stainless steel.

17. The rack of claim 1, wherein said frame includes members connected to each other by spot welding.

18. The rack of claim 17, wherein said frame includes at least one threaded connection between said members to allow removal of said dividers.

19. The rack of claim 18, wherein said at least one threaded connection includes bolts through an upper horizontal member disposed at one end of said frame.

20. A rack adapted to hold at least one innerlayer component of a printed circuit board, comprising:

a pair of end dividers, each end divider including an end divider end surface formed with a plurality of longitudinally extending fingers having a longitudinally extending groove disposed between consecutive ones of the fingers and a base member connected transversely to the end divider end surface to form a receiving wall at a respective distal end of each groove;

a middle divider including a plurality of longitudinally extending middle fingers having a longitudinally extending slot formed between and through consecutive ones of the middle fingers; and a frame connected to the pair of end dividers and the middle divider with the middle divider disposed between the pair of end dividers such that the pair of end dividers and the middle divider are slidably contained and cradled within the frame so that the at least one innerlayer component can be received by a pair of grooves and a slot axially aligned with each other whereby the innerlayer component contacts respective ones of the receiving walls for holding the at least one innerlayer component in isolation from the frame.

21. A rack according to claim 20, wherein the pair of end dividers and the intermediate divider include an aperture formed into a respective one of the fingers and intermediate fingers at a receiving end portion of the pair of end dividers and the intermediate divider.

22. A rack according to claim 21, further comprising a plurality of separator rods, each separator rod sized for slidable insertion into respective axially aligned apertures in the pair of end dividers and the intermediate divider.

23. A rack according to claim 20, wherein the frame includes a support rod operative for allowing the rack to pivot in a machine frame so that at least one innerlayer component can be loaded or unloaded when the rack is pivoted.

24. A rack according to claim 23, further comprising a midlevel stop disposed to limit a range through which the rack can pivot.

25. A rack according to claim 24, wherein the midlevel stop limits the range by engaging the machine frame.

* * * * *